(12) United States Patent
Hossain et al.

(10) Patent No.: US 10,950,537 B2
(45) Date of Patent: Mar. 16, 2021

(54) LAND SIDE AND DIE SIDE CAVITIES TO REDUCE PACKAGE Z-HEIGHT

(71) Applicant: Intel Corporation, Santa Clara, CA (US)

(72) Inventors: Md Altaf Hossain, Portland, OR (US); Scott Gilbert, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/417,112

(22) Filed: May 20, 2019

(65) Prior Publication Data

US 2020/0051901 A1 Feb. 13, 2020

Related U.S. Application Data

(60) Continuation of application No. 15/664,735, filed on Jul. 31, 2017, now Pat. No. 10,297,542, which is a
(Continued)

(51) Int. Cl.
*H01L 23/522* (2006.01)
*H01L 23/00* (2006.01)
(Continued)

(52) U.S. Cl.
CPC ...... *H01L 23/49838* (2013.01); *H01L 21/486* (2013.01); *H01L 21/4853* (2013.01); *H01L 21/4857* (2013.01); *H01L 21/7687* (2013.01); *H01L 21/76802* (2013.01); *H01L 21/76877* (2013.01); *H01L 23/13* (2013.01); *H01L 23/49822* (2013.01); *H01L 23/49894* (2013.01);
(Continued)

(58) Field of Classification Search
CPC ............ H01L 21/4857; H01L 23/5222; H01L 23/5389; H01L 24/82
USPC .................................. 361/760, 763; 257/532
See application file for complete search history.

(56) References Cited

U.S. PATENT DOCUMENTS 5,260,518 A 11/1993 Tanaka et al.
5,875,100 A 2/1999 Yamashita
(Continued)

OTHER PUBLICATIONS

"U.S. Appl. No. 13/631,669, Examiner Interview Summary dated Oct. 23, 2015", 3 pgs.
(Continued)

*Primary Examiner* — David Vu
*Assistant Examiner* — Brandon C Fox
(74) *Attorney, Agent, or Firm* — Schwegman Lundberg & Woessner, P.A.

(57) ABSTRACT

A package structure including a capacitor mounted within a cavity in the package substrate is disclosed. The package structure may additionally include a die mounted to a die side surface of the package substrate, and the opposing land side surface of the package substrate may be mounted to a printed circuit board (PCB). The capacitor may be mounted within a cavity formed in the die side surface of the package substrate or the land side surface of the package substrate. Mounting a capacitor within a cavity may reduce the form factor of the package. The die may be mounted within a cavity formed in the die side surface of the package substrate. Solder balls connecting the package to the PCB may be mounted within one or more cavities formed in one or both of the package substrate and the PCB.

20 Claims, 10 Drawing Sheets

Related U.S. Application Data continuation of application No. 15/419,087, filed on Jan. 30, 2017, now Pat. No. 9,721,882, which is a continuation of application No. 15/057,013, filed on Feb. 29, 2016, now Pat. No. 9,799,556, which is a division of application No. 13/631,669, filed on Sep. 28, 2012, now Pat. No. 9,293,426.

(51) Int. Cl.
| | |
|---|---|
| H01L 23/64 | (2006.01) |
| H01L 23/498 | (2006.01) |
| H01L 23/13 | (2006.01) |
| H01L 25/16 | (2006.01) |
| H05K 1/11 | (2006.01) |
| H01L 21/48 | (2006.01) |
| H01L 21/768 | (2006.01) |
| H01L 49/02 | (2006.01) |
| H01L 23/538 | (2006.01) |
| H01L 25/065 | (2006.01) |
| H05K 1/18 | (2006.01) |
| H04M 1/02 | (2006.01) |

(52) U.S. Cl.
CPC ...... *H01L 23/5222* (2013.01); *H01L 23/5389* (2013.01); *H01L 23/642* (2013.01); *H01L 24/16* (2013.01); *H01L 24/82* (2013.01); *H01L 25/0657* (2013.01); *H01L 25/16* (2013.01); *H01L 28/40* (2013.01); *H01L 28/60* (2013.01); *H05K 1/111* (2013.01); *H05K 1/181* (2013.01); *H01L 23/49816* (2013.01); *H01L 2224/16225* (2013.01); *H01L 2224/16227* (2013.01); *H01L 2224/16237* (2013.01); *H01L 2224/32225* (2013.01); *H01L 2224/73204* (2013.01); *H01L 2225/06572* (2013.01); *H01L 2225/107* (2013.01); *H01L 2225/1023* (2013.01); *H01L 2225/1058* (2013.01); *H01L 2924/15153* (2013.01); *H01L 2924/15159* (2013.01); *H01L 2924/15174* (2013.01); *H01L 2924/15311* (2013.01); *H01L 2924/19105* (2013.01); *H01L 2924/19106* (2013.01); *H04M 1/0266* (2013.01); *H05K 1/183* (2013.01); *H05K 2201/09472* (2013.01); *H05K 2201/10015* (2013.01); *H05K 2201/10378* (2013.01); *Y02P 70/50* (2015.11)

(56) References Cited

U.S. PATENT DOCUMENTS

| | | | |
|---|---|---|---|
| 5,939,782 | A | 8/1999 | Malladi |
| 6,272,020 | B1 | 8/2001 | Tosaki et al. |
| 6,507,119 | B2 | 1/2003 | Huang et al. |
| 6,577,490 | B2 | 6/2003 | Ogawa et al. |
| 6,953,893 | B1 | 10/2005 | Kuzmenka |
| 7,061,102 | B2 | 6/2006 | Eghan et al. |
| 7,084,500 | B2 | 8/2006 | Swnson et al. |
| 7,102,085 | B2 | 9/2006 | Ohta et al. |
| 7,112,520 | B2 | 9/2006 | Lee et al. |
| 7,531,906 | B2 | 5/2009 | Lee |
| 7,745,926 | B2 | 6/2010 | Miyazaki et al. |
| 8,130,507 | B2 | 3/2012 | Origuchi et al. |
| 8,183,465 | B2 | 5/2012 | Suzuki et al. |
| 9,293,426 | B2 | 3/2016 | Hossain et al. |
| 9,721,882 | B2 * | 8/2017 | Hossain ............... H01L 21/486 |
| 9,799,556 | B2 | 10/2017 | Hossain et al. |
| 10,297,542 | B2 | 5/2019 | Hossain et al. |
| 2004/0022038 | A1 | 2/2004 | Figueroa et al. |
| 2005/0218502 | A1 | 10/2005 | Sunohara et al. |
| 2008/0142961 | A1 | 6/2008 | Jones et al. |
| 2009/0314538 | A1 | 12/2009 | Jomaa et al. |
| 2011/0239456 | A1 | 10/2011 | Conn et al. |
| 2013/0134596 | A1 | 5/2013 | Hu et al. |
| 2014/0054773 | A1 | 2/2014 | Kurashima et al. |
| 2014/0360765 | A1 | 12/2014 | Kiwanami et al. |
| 2016/0181145 | A1 | 6/2016 | Hossain et al. |
| 2017/0141024 | A1 | 5/2017 | Hossain et al. |
| 2018/0108605 | A1 | 4/2018 | Hossain et al. |

OTHER PUBLICATIONS

"U.S. Appl. No. 13/631,669, Final Office Action dated Jul. 2, 2015", 16 pgs.
"U.S. Appl. No. 13/631,669, Non Final Office Action dated Mar. 3, 2015", 15 pgs.
"U.S. Appl. No. 13/631,669, Non Final Office Action dated Aug. 12, 2014", 12 pgs.
"U.S. Appl. No. 13/631,669, Notice of Allowance dated Jan. 4, 2016", 8 pgs.
"U.S. Appl. No. 13/631,669, Notice of Allowance dated Nov. 20, 2015", 11 pgs.
"U.S. Appl. No. 13/631,669, Response filed Jun. 3, 2015 to Non Final Office Action dated Mar. 3, 2015", 13 pgs.
"U.S. Appl. No. 13/631,669, Response filed Jul. 2, 2014 to Restriction Requirement dated Jun. 26, 2014", 8 pgs.
"U.S. Appl. No. 13/631,669, Response filed Oct. 2, 2015 to Final Office Action dated Jul. 2, 2015", 10 pgs.
"U.S. Appl. No. 13/631,669, Response filed Nov. 12, 2014 to Non Final Office Action dated Aug. 12, 2014", 12 pgs.
"U.S. Appl. No. 13/631,669, Restriction Requirement dated Jun. 26, 2014", 7 pgs.
"U.S. Appl. No. 15/057,013, Final Office Action dated Mar. 9, 2017", 18 pgs.
"U.S. Appl. No. 15/057,013, Non Final Office Action dated Sep. 20, 2016", 15 pgs.
"U.S. Appl. No. 15/057,013, Notice of Allowance dated Jun. 19, 2017", 11 pgs.
"U.S. Appl. No. 15/057,013, Response filed Feb. 21, 2017 to Non Final Office Action dated Sep. 20, 2016", 7 pgs.
"U.S. Appl. No. 15/057,013, Response filed May 9, 2017 to Final Office Action dated Mar. 9, 2017", 8 pgs.
"U.S. Appl. No. 15/419,087, Notice of Allowance dated Mar. 27, 2017", 9 pgs.
"U.S. Appl. No. 15/664,735, Non Final Office Action dated Feb. 22, 2018", 5 pgs.
"U.S. Appl. No. 15/664,735, Notice of Allowance dated Jan. 9, 2019", 10 pgs.
"U.S. Appl. No. 15/664,735, Response Filed Aug. 22, 2018 to Non Final Office Action dated Feb. 22, 2018", 4 pgs.

* cited by examiner

US 10,950,537 B2

LAND SIDE AND DIE SIDE CAVITIES TO REDUCE PACKAGE Z-HEIGHT

This is a Divisional of application Ser. No. 13/631,669 filed Sep. 28, 2012, which is presently pending.

BACKGROUND

Mobile, tablet, and ultrabook technologies require components with increasingly reduced dimensions. The form factor of a semiconductor package, including the "z-height" and x-y dimensions, is limited by the components contained within the package. Components are typically mounted on the surface of a package substrate, and as such the dimensions of the package are generally determined by the z-height of the components and the surface area required to accommodate the components on the surface of the package substrate.

DETAILED DESCRIPTION

Figure 1A:
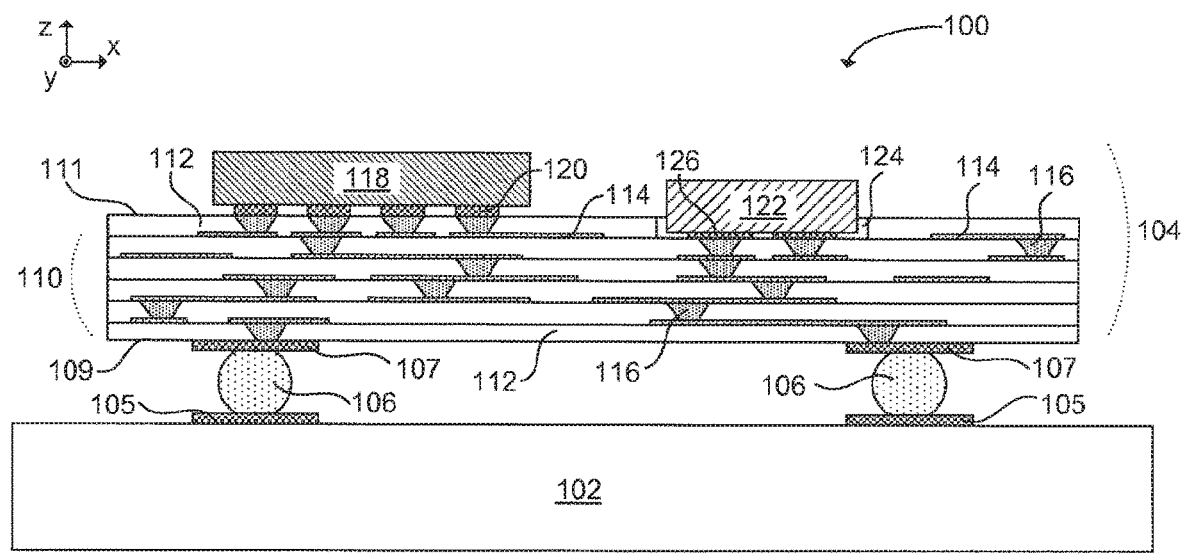
FIGS. 1A-1D illustrate a cross sectional view of a semiconductor device including a package substrate having a die side capacitor (DSC) mounted in a cavity formed in a die side buildup layer, according to an embodiment of the invention.
Figure 1B:
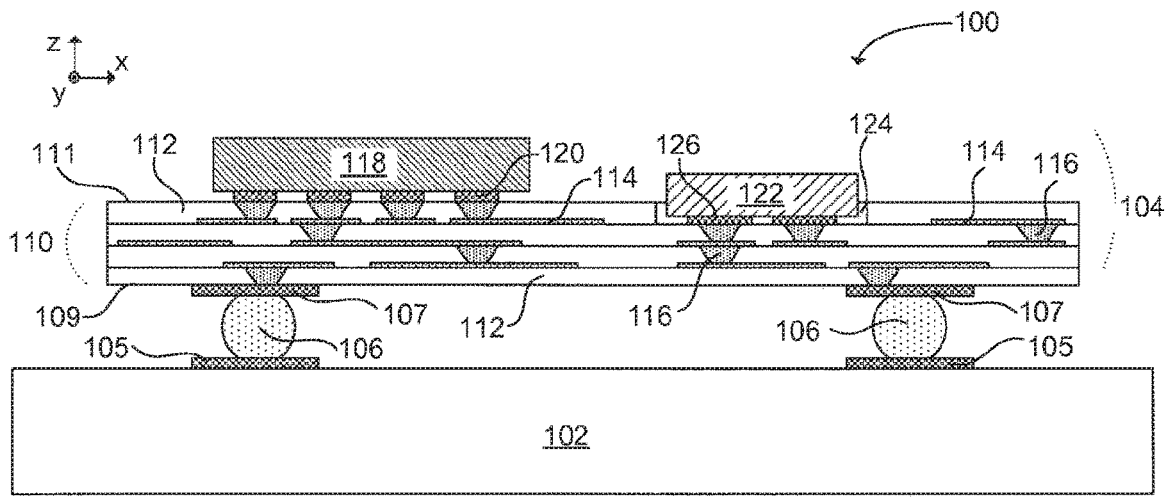

A semiconductor package having reduced form factor, and method of forming a reduced form factor semiconductor package are described. In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "an embodiment" or the like in various places throughout this specification are not necessarily referring to the same embodiment of the invention. Furthermore, the particular features, structures, configurations, or characteristics may be combined in any suitable manner in one or more embodiment.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

In one aspect, embodiments of the invention describe a package with a reduced form factor having a capacitor mounted within a cavity formed in at least one buildup layer in the package substrate. For example, a package may include a package substrate having a die side surface to which a die is mounted and a land side surface, which is mounted to a printed circuit board (PCB). The package substrate may include a plurality of buildup layers. A cavity may be formed in one or more die side buildup layers. A die side capacitor (DSC) may be mounted within the cavity. Because the height that the DSC extends above the die side surface is thus reduced by the depth of the cavity, the total z-height of the package may be reduced where the DSC is a limiting factor.

In another embodiment, a cavity may be formed in one or more land side buildup layers of the package substrate. A land side capacitor (LSC) may be mounted within the cavity. The height of the LSC may be a factor in establishing the minimum standoff distance between the package and the PCB, and as such, may affect the minimum size solder ball used in a ball grid array (BGA) mounting structure. By mounting the LSC within a cavity, the amount that the LSC protrudes from the land surface of the package substrate is reduced, also reducing the minimum required standoff distance and the minimum required solder ball size. Smaller solder balls may be spaced closer together, requiring less package surface area for a constant number of BGA connections. As such, in addition to reducing the z-height of a package, mounting an LSC within a cavity in the land surface of the package substrate may reduce the x-y dimensions of the package.

In another aspect, embodiments of the invention describe a package having reduced cost. Mounting a capacitor within a cavity in the surface of the package substrate may allow expensive, low-profile capacitors to be replaced with cheaper, larger capacitors without increasing the package z-height.

In another aspect, embodiments of the invention describe a package with a reduced z-height having a semiconductor die mounted within a cavity formed in at least one buildup layer in the package substrate. Where the height of a die is the limiting factor determining the z-height of a package, mounting the die within a cavity formed in one or more land side buildup layers of the package substrate may enable reduced z-dimensions of the overall package. One or more cavities may be formed in the active surface of the die, and the bumps connecting the die to the package substrate may be formed inside the cavity in order to reduce the z-height of the die protruding above the die side surface of the package substrate.

In another aspect, embodiments of the invention describe a package with a reduced z-height having BGA solder balls mounted within cavities formed in at least one buildup layer in one or both of the package substrate and the PCB. For example, land side cavities are formed in one or more land side buildup layers of the package substrate. The height of the solder ball that is contained within the cavity reduces the z-height of the assembly including the package and the PCB. In another embodiment, PCB cavities are formed in one or more buildup layers of the PCB. The BGA solder balls may be mounted within the cavities, reducing the contribution of the BGA solder joints to the overall z-height of the assembly including the package. Where packages are mounted to opposing sides of the PCB, cavities may be formed in each side of the PCB in order to reduce the total z-dimension of the assembly.

In yet another aspect, embodiments of the invention describe a method for forming a package having a reduced form factor by embedding one or more package components within a cavity formed in at least one buildup layer in the package substrate. A package substrate having a plurality of buildup layers is laser drilled to form a cavity extending through one or more buildup layers. A component, such as a capacitor, may be mounted within the cavity. The method reduces the contribution of surface-mounted components to the overall z-height of a semiconductor package.

FIGS. 1A-1E illustrate a semiconductor device having reduced z-height including a capacitor mounted within a cavity in the package substrate, according to an embodiment of the invention. In FIG. 1A, semiconductor device 100 includes a package 104 mounted to a PCB 102, according to an embodiment. In an embodiment, PCB 102 is a motherboard or system board for a PC, ultrabook, tablet, or mobile device. In another embodiment, PCB 102 is a daughter card that is to be placed on a motherboard. In an embodiment, PCB 102 is a conventional multilayer PCB comprising a plurality of PCB buildup layers (not shown). In an embodiment, the PCB buildup layers are each from 40 to 60 um thick. It is to be understood that PCB 102 may have additional components and/or packages mounted thereon.

In an embodiment, package 104 includes a package substrate 110 and a number of components mounted thereto, for example, die 118 and die side capacitor (DSC) 122. It is to be understood that additional active and passive surface components may be mounted to package 104. Package substrate 110 has a land side 109 facing PCB 102 and a die side 111, on which die 118 is mounted, according to an embodiment of the invention. Package substrate 110 is connected to PCB 102 via a plurality of solder balls 106, according to an embodiment of the invention. In an embodiment, solder balls 106 are mounted to conductive pads 107 on package substrate 110. In an embodiment, solder balls 106 are mounted to conductive pads 105 on PCB 102.

In an embodiment, package substrate 110 is a conventional multilayer substrate, including a plurality of buildup layers 112. Package substrate 110 may have any number of buildup layers 112. In an embodiment, package substrate 110 has six buildup layers 112, as shown in FIG. 1A. In another embodiment, package substrate 110 has four buildup layers, as shown in FIGS. 113 and 1C.

Buildup layers 112 conform to conventional configurations for such layers as commonly used in multilayer package substrates. In an embodiment, buildup layers 112 have a configuration adapted to allow the routing of electricity/signals at various levels within the multilayer substrate as would be readily recognized by one of ordinary skill in the art. Buildup layers 112 include dielectric material, metallization lines 114 and through vias 116, according to an embodiment. In an embodiment, metallization lines 114 and through vias 116 interconnect components mounted to the package substrate 110 and lands connecting package 104 to PCB 102. A variety of dielectric materials may be used to form buildup layers 112, as is known in the art, for example, ABF or polyimide. Metallization lines 114 and through vias 116 may be formed from a suitable conductive material, for example, copper. In an embodiment, each buildup layer is from 10-50 um thick.

Figure 1C:
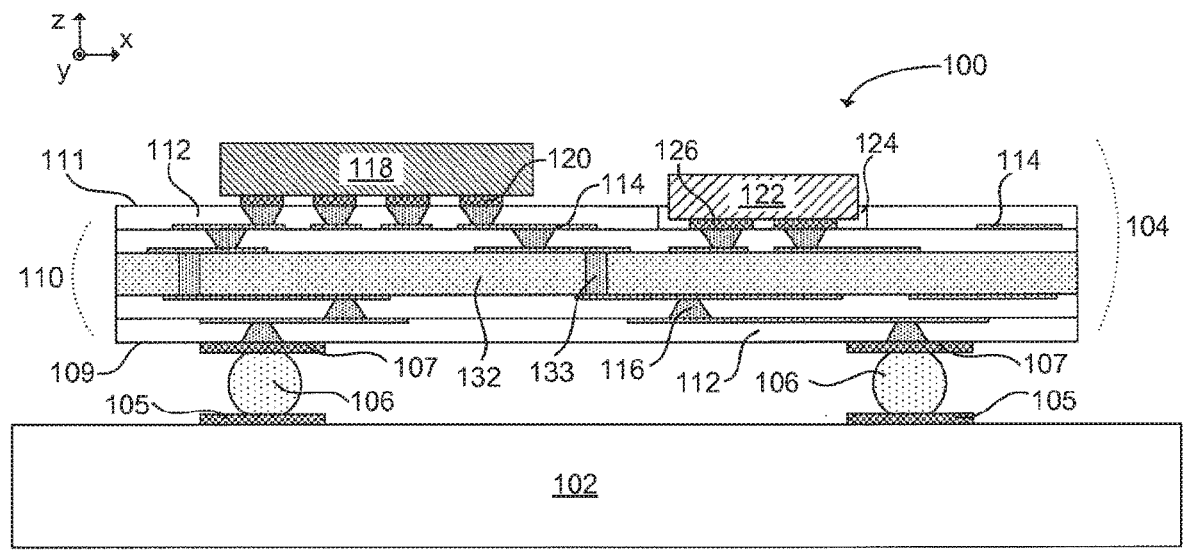

In an embodiment, package substrate 110 additionally comprises a core 132, as shown in FIG. 1C. Core 132 may be formed from an insulative material, for example, bismaleimide triazine (BT). In an embodiment, plated through vias 133 extend through core layer 132 in order to electrically connect buildup layers on opposing sides of the core. Plated through vias 133 may be formed from an appropriate conductive material, such as copper.

Referring back to FIG. 1A, cavity 124 extends through one buildup layer 112 on the die side surface 111 of package substrate 110, according to an embodiment of the invention. DSC 122 is mounted within cavity 124, according to an embodiment of the invention. In an embodiment, DSC 122 is mounted to package substrate 110 via conductive pads 126. In an embodiment, conductive pads 126 are located at least partially within cavity 124. In an embodiment, conductive pads 126 connect to metallization 114 within package substrate 110. Conductive pads 126 may be formed from any suitable material, for example, Cu. In an embodiment, mounting DSC 122 within cavity 124 reduces the z-height of package 104. In an embodiment, the z-height of the package is reduced by an amount corresponding to the thickness of one or more buildup layers 112. In an embodiment, the z-height of the package is reduced by 20-80 um.

Figure 1D:
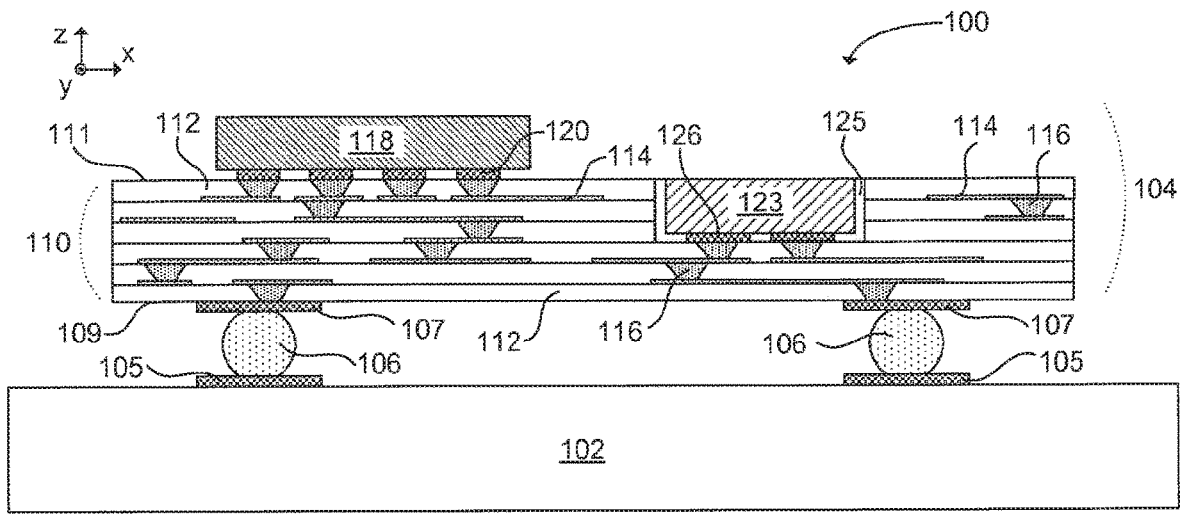

In FIG. 1D, the die side surface 111 of package substrate 110 contains a cavity 125 extending through three buildup layers 112, according to an embodiment of the invention. DSC 123 is mounted within cavity 125, according to an embodiment. In an embodiment, DSC 123 is mounted within cavity 125 via conductive pads 126. In an embodiment, the depth of cavity 125 is such that DSC 123 does not protrude from the die side surface 111 of package substrate 110. In another embodiment, DSC 123 protrudes from the die side surface 111.

Figure 1E:
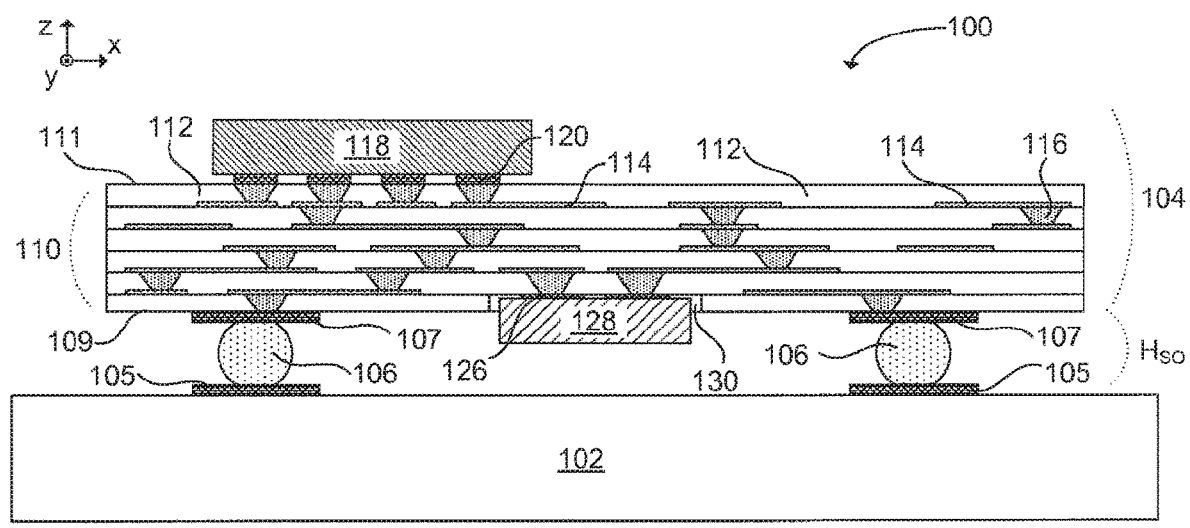
FIG. 1E illustrates a cross sectional view of a semiconductor device including a package substrate having a land side capacitor (LSC) mounted in a cavity formed in a land side buildup layer, according to an embodiment of the invention.

In FIG. 1E, semiconductor device 100 includes a package 104 having a land side capacitor (LSC) 128 mounted in a cavity 130 formed within the land side surface 109 of package substrate 110, according to an embodiment of the invention. In an embodiment, cavity 130 is formed in the outer buildup layer 112 on the land side surface 109 of package substrate 110, as shown in FIG. 1E. In another embodiment, cavity 130 is formed within two or more buildup layers 112. LSC 128 may be mounted in cavity 130 via conductive pads 126. In an embodiment, at least a portion of LSC 128 protrudes from the land surface 109. In another embodiment, LSC is fully embedded within cavity 130; that is, LSC 128 does not protrude from the land side surface 109.

In an embodiment, the height of the LSC 128 protruding from the land side 109 of package substrate 110 is a limiting factor in determining the minimum standoff height $H_{SO}$ between the package 104 and the PCB 102. As such, mounting LSC 128 within a cavity 130 may enable reduction of the standoff height $H_{SO}$ as compared to mounting a capacitor directly on the land side surface 109 of package substrate 110. A reduced standoff height $H_{SO}$ may reduce the overall z-height of the semiconductor device 100. Additionally, the standoff height $H_{SO}$ may be reduced by using smaller solder balls, which may be spaced closer together than the larger solder balls associated with the larger standoff height. The reduced solder ball spacing reduces the surface area required to accommodate a given number of connections between the package and the PCB, enabling reduction of the x-y dimensions of the package. Furthermore, mounting LSC 128 within cavity 130 may allow the use of a cheaper, larger capacitor without increasing the z-height of the package.

Figure 2A:
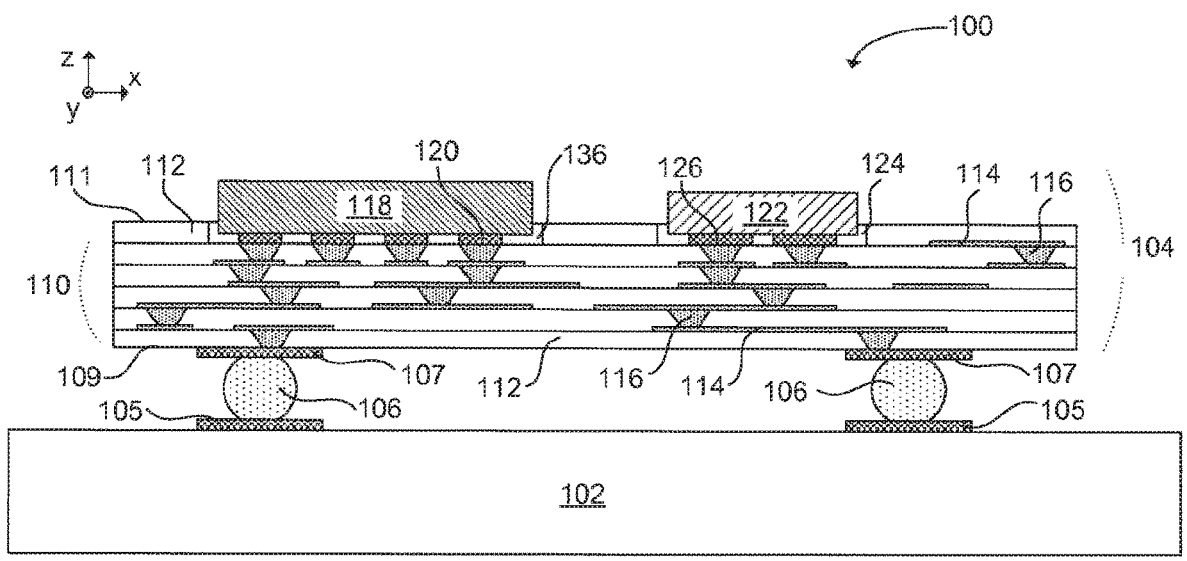
FIGS. 2A-2B illustrate a cross sectional view of a semiconductor device including a package substrate having a capacitor and a die each mounted in a cavity formed in an outer buildup layer, according to an embodiment of the invention.
Figure 2B:
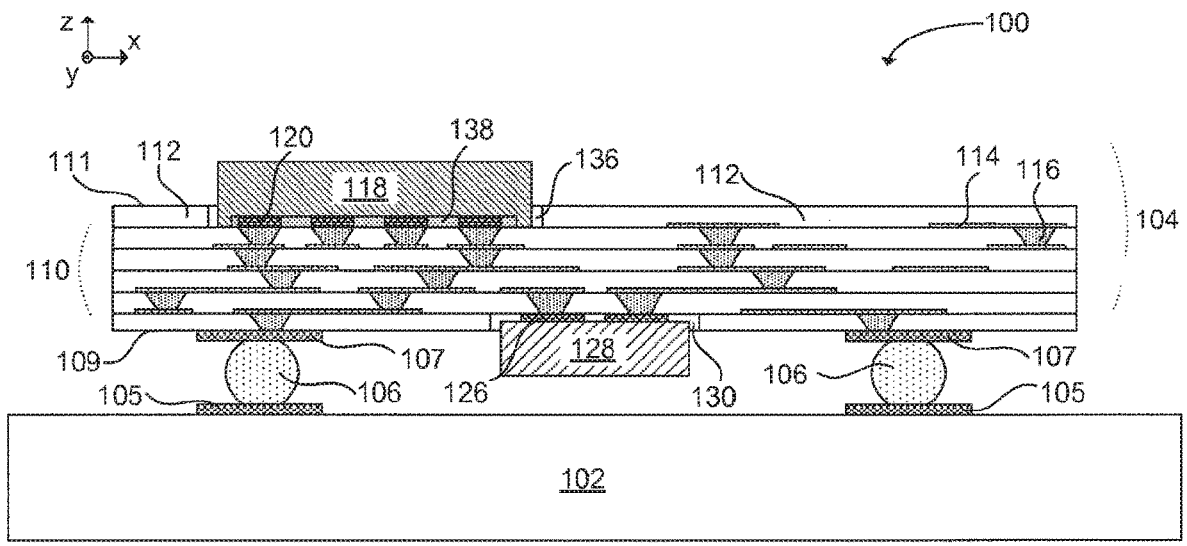

FIGS. 2A-2B illustrate a semiconductor device including a die and a capacitor each mounted in a cavity in the surface of the package substrate in order to reduce the z-height of the package, according to an embodiment of the invention. In FIG. 2A, a cavity 136 extends through one outer buildup layer 112 on the die side 111 of package substrate 110, according to an embodiment. In another embodiment, cavity 136 extends through a plurality of buildup layers 112. In an embodiment, semiconductor die 118 is mounted within cavity 136. In an embodiment, semiconductor die 118 may be mounted via bumps 120.

Cavity 124 extends through one outer buildup layer 112 on the dies side 111 of package substrate 110, according to an embodiment. In an embodiment, DSC 122 is mounted within cavity 124. While cavity 124 and cavity 136 are illustrated having the same depth of one buildup layer 112, it is to be understood that cavity 124 and cavity 136 may have different depths in other embodiments. In addition, a package 104 may comprise an LSC mounted on the land side surface 109 of the package substrate 110 in addition to DSC 122, according to an embodiment. In another embodiment, the package 104 comprises an LSC on the land side 109 of the package substrate in lieu of DSC 122.

By mounting both the die 118 and the DSC 122 each in a cavity in the package substrate surface, the impact that the die 118 and DSC 122 have on the package z-height is reduced. In an embodiment, mounting die 118 within cavity 136 reduces the z-height of package 104 by an amount corresponding to the thickness of one or more buildup layers 112. In an embodiment, mounting die 118 within cavity 136 reduces the z-height of the package substrate 104 by 20-40 um.

In FIG. 2B, die 118 has a die cavity 138 in the active surface of the die, according to an embodiment of the invention. In an embodiment, die cavity 138 is a single cavity formed within the surface of die 118. In another embodiment, each bump 120 is recessed within an individual cavity 138. In an embodiment, recessing bumps 120 within die cavity 138 further reduces the height of the die 118 protruding from the die side surface 111 of the package substrate 110 by 5-15 um.

Figure 3A:
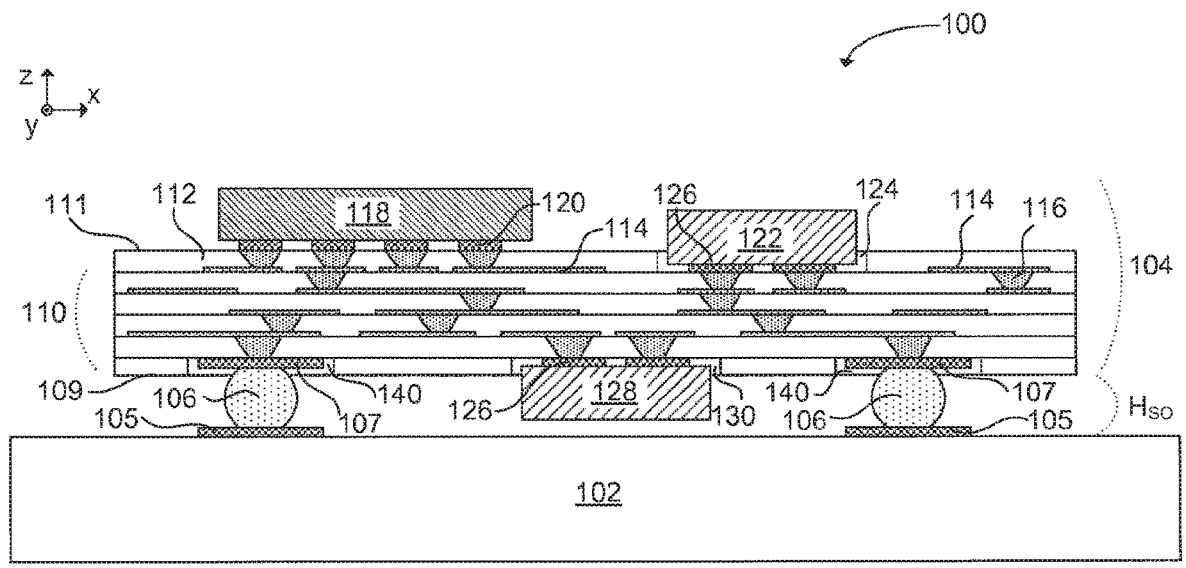
FIG. 3A illustrates a cross sectional view of a semiconductor device including a package mounted to a PCB, where the package substrate has cavities formed in a land side buildup layer in which an LSC and solder balls are each mounted, according to an embodiment of the invention.
Figure 3B:
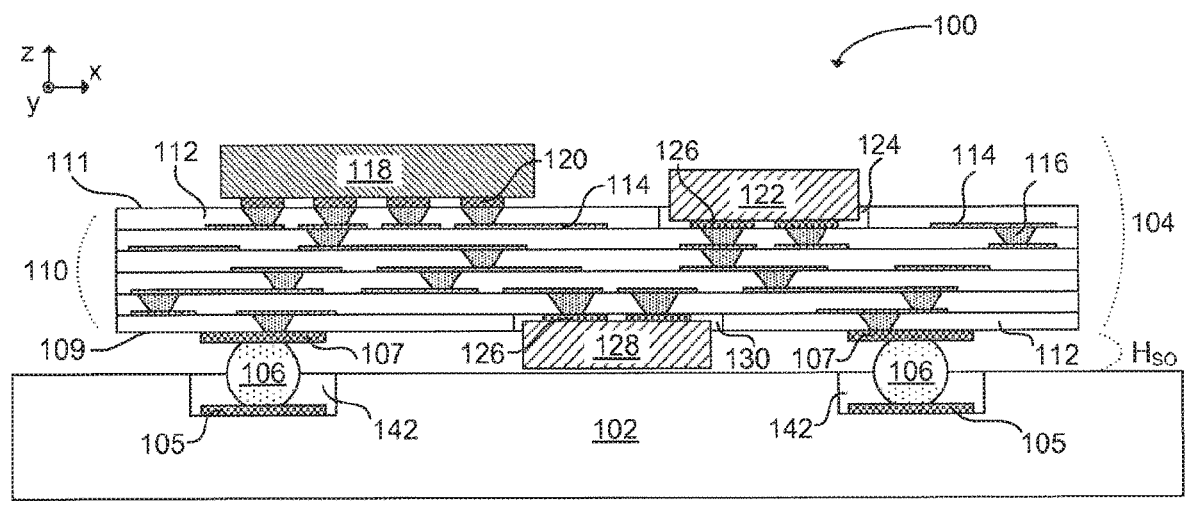
FIG. 3B illustrates a cross sectional view of a semiconductor device including a package mounted to a PCB, where the package substrate has a cavity formed in a die side buildup layer in which a DSC is mounted and where the solder balls are mounted in cavities formed in a land side buildup layer of the PCB, according to an embodiment of the invention.
Figure 3C:
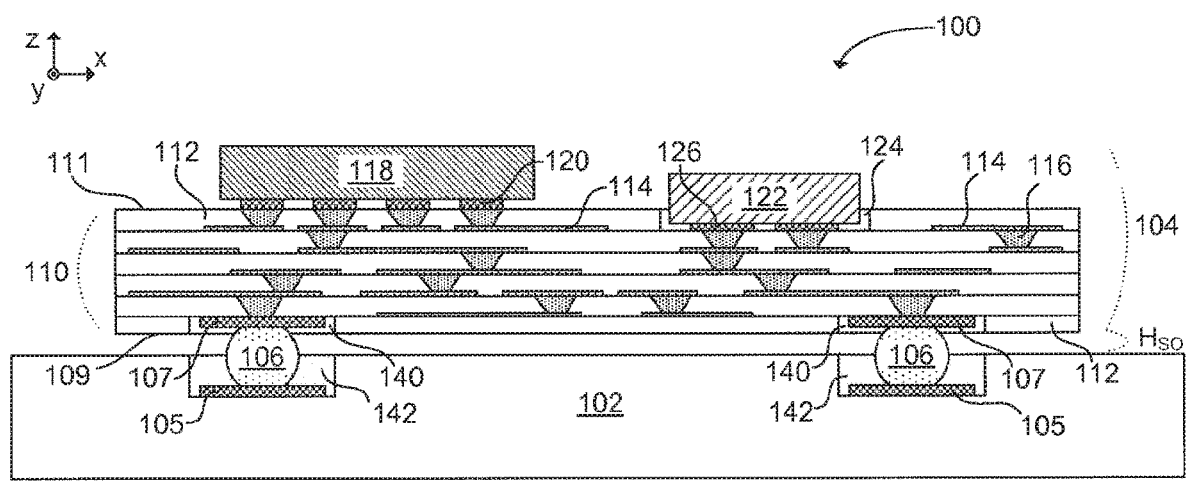
FIG. 3C illustrates a cross sectional view of a semiconductor device including a package mounted to a PCB, where the package substrate has a cavity formed in a die side buildup layer in which a DSC is mounted and cavities formed in a land side buildup layer in which solder balls are mounted, and where the solder balls are also mounted in cavities formed in a land side buildup layer of the PCB, according to an embodiment of the invention.

FIGS. 3A-3C each illustrate a cross sectional view of a package mounted to a PCB via a plurality of solder balls, where the solder balls are recessed in one or both of the package substrate and the PCB in order to reduce the z-height of the semiconductor device, according to an embodiment of the invention. In FIG. 3A, solder balls 106 connect the package 104 to PCB 102, according to an embodiment of the invention. In an embodiment, solder balls 106 are mounted within land side cavities 140 in the land side surface 109 of package substrate 110. In an embodiment, land side cavities 140 extend through one outer buildup layer 112 on land side 109. In another embodiment, land side cavities 140 extend through a plurality of buildup layers 112 on land side 109. In an embodiment, solder balls 106 are mounted to package 110 via conductive pads 107 within land side cavities 140. By mounting solder balls 106 within land side cavities 140, the standoff height $H_{SO}$ between the package 104 and PCB 102 is reduced, reducing the overall system z-height. In an embodiment, the standoff height $H_{SO}$ is reduced by 20-40 um.

Package substrate 110 has a cavity 130 formed in the outer buildup layer 112 on land side 109, according to an embodiment. In an embodiment, LSC 128 is accommodated within the reduced $H_{SO}$ by mounting LSC 128 within cavity 130. In an embodiment, package 104 includes DSC 122, mounted within cavity 124 in the die side surface 111 of package substrate 110. Mounting DSC 122 within cavity 124 may reduce the z-height of package 104 by an amount corresponding to the thickness of one or more buildup layers 112. In an embodiment, mounting DSC 122 within cavity 124 reduces the z-height of package 104 by 20-40 um. Though both an LSC and DSC are shown in FIG. 3A, another embodiment of the package 104 includes a die 118 and a DSC 122, each mounted within a cavity in package substrate 110, without including an LSC mounted within a cavity. In another embodiment, package 104 includes a die 118 and an LSC 128, each mounted within a cavity in package substrate 110, without including a DSC mounted within a cavity.

In FIG. 3B, solder balls 106 are mounted within PCB cavities 142 in PCB 102, according to an embodiment of the invention. In an embodiment, PCB cavities 142 are formed in one or more buildup layers of the PCB 102. In an embodiment, conductive pads 105 are formed within PCB cavities 142. In an embodiment, solder balls 106 are mounted to PCB 102 via conductive pads 105. In an embodiment, by mounting solder balls 106 within PCB cavities 142 in PCB 102, the standoff height $H_{SO}$ and is reduced by 40-60 um.

In an embodiment, package 104 in FIG. 3B includes DSC 122 mounted within a cavity 124 formed in the die side surface 111 of package substrate 110. In an embodiment, package 104 in FIG. 3B includes LSC 128 mounted within a cavity 130 formed in the land side surface 109 of package substrate 110. In an embodiment, package substrate 110 includes only one of cavity 124 containing DSC 122 and cavity 130 containing LSC 128.

In FIG. 3C, solder balls 106 are mounted within land side cavities 140 in land surface 109 of package substrate 110 and PCB cavities 142 in PCB 102, according to an embodiment of the invention. By mounting solder balls 106 within cavities in both the package substrate 110 and PCB 102, the standoff height $H_{SO}$ and the overall z-height of the semiconductor device 100 is reduced. In an embodiment, cavities 140 and 142 enable a reduction of the standoff height $H_{SO}$ and the z-height of package 104 by 60-100 um.

In an embodiment, package 104 in FIG. 3C includes DSC 122 mounted within a cavity 124 formed in the die side surface 111 of package substrate 110. In an embodiment, package 104 in FIG. 3C includes LSC 128 mounted within a cavity 130 formed in the land side surface 109 of package substrate 110. In an embodiment, package substrate 110 includes only one of cavity 124 containing DSC 122 and cavity 130 containing LSC 128.

Figure 4:
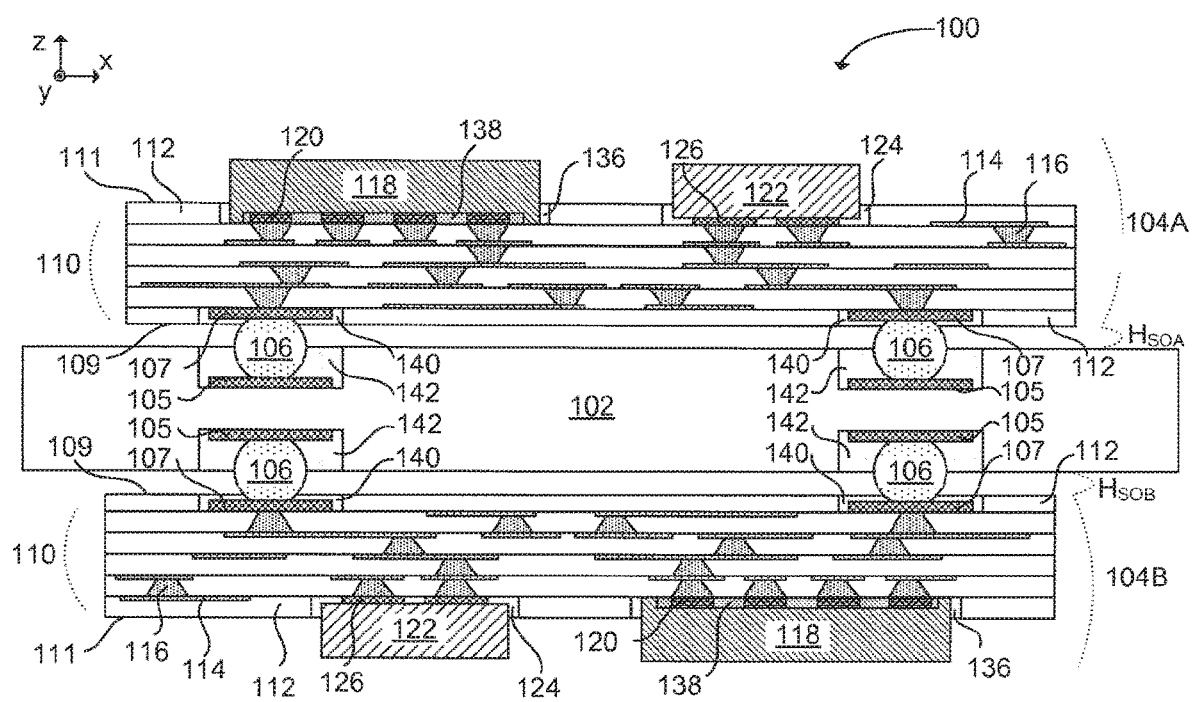
FIG. 4 illustrates a cross sectional view of a semiconductor device having two packages mounted to opposing sides of a PCB, where each package has cavities in which a die, a capacitor, solder balls are mounted, and where the solder balls are mounted within cavities in the PCB, according to an embodiment of the invention.

FIG. 4 illustrates a cross sectional view of a semiconductor device 100 including two packages 104A and 104B mounted to opposing sides of PCB 102, where the semiconductor device 100 has reduced z-height, according to an embodiment of the invention. In an embodiment of the invention, solder balls 106 are each mounted in a pair of cavities 140 and 142 in package substrates 110 and PCB 102, respectively, as described above with respect to FIG. 3C. In an embodiment, cavities 140 and 142 enable a reduction of the overall system z-height by reducing the standoff height $H_{SO}$ between package substrates 110 and PCB 102. In an embodiment, each standoff height $H_{SOA}$ and $H_{SOB}$ is reduced by 60-100 um.

Dies 118 are each mounted in a cavity 136 within a buildup layer 112 on die side 111 of each package substrate 110, according to an embodiment. In addition, bumps 120 are located within die cavity 138 formed in the active surface of each die 118, according to an embodiment, as discussed above with respect to FIG. 2B. By recessing bumps 120 within cavities 136 and 138, the height of die 118 protruding from the die side surface 111 of a package substrate 110 may be reduced. In an embodiment, the z-height of packages 104A and 104B are each reduced by 25-50 um.

As compared to a semiconductor device having similar components but no cavities, the device 100 illustrated in FIG. 4 may have a reduced z-height due to the use of cavities 124, 136, 138, 140, and 142, in packages 104A and 104B mounted on opposing sides of the PCB 102, according to an embodiment of the invention. In an embodiment, the z-height of device 100 is reduced up to 300 um as compared to conventional systems that do not have cavities.

FIGS. 5A-5E illustrate a method for mounting a capacitor in a cavity formed in one or more buildup layers of the package substrate, according to an embodiment of the invention. A package substrate 510 is provided in FIG. 5A, according to an embodiment. Package substrate 510 may be a commercially available multilayer substrate. In an embodiment, package substrate 510 includes a plurality of buildup layers 512. In an embodiment, buildup layers 512 include metallization lines 514 and through vias 516.

Figure 5A:
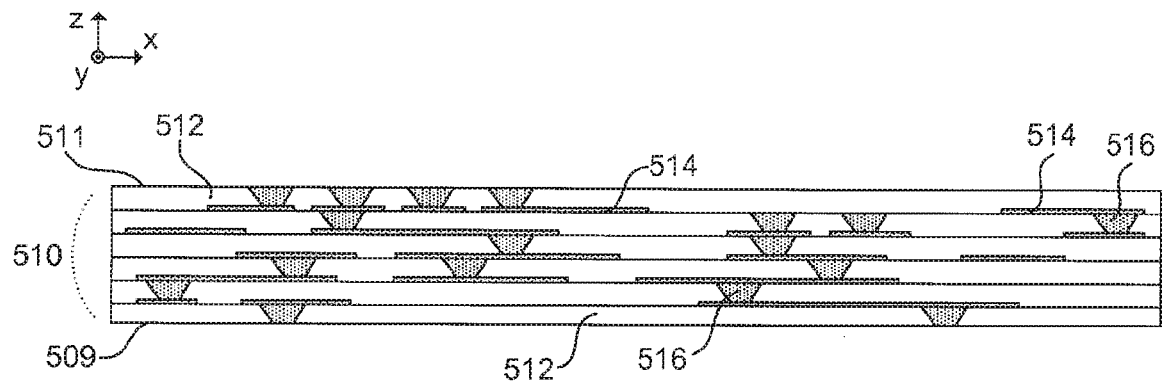
FIGS. 5A-5E illustrate a cross sectional view of a method for forming a cavity in a package substrate and mounting a capacitor therein, according to an embodiment of the invention.
Figure 5B:
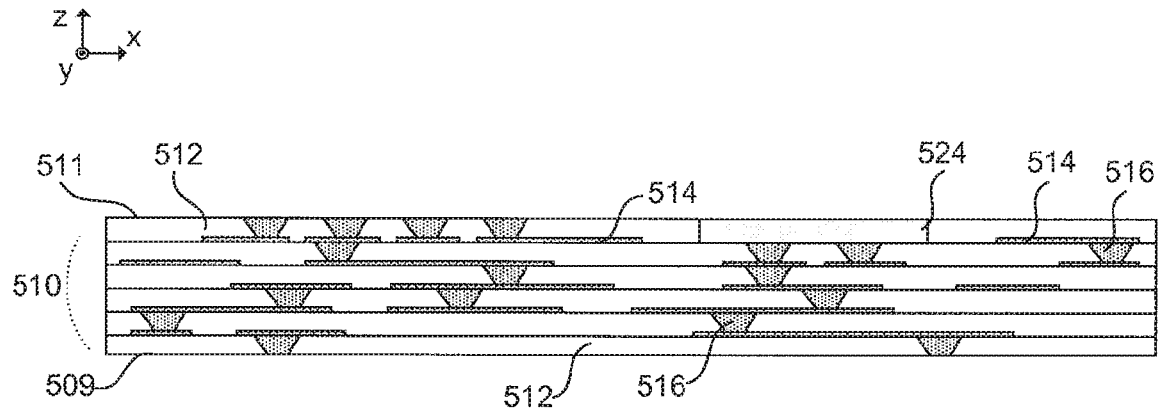
Figure 5C:
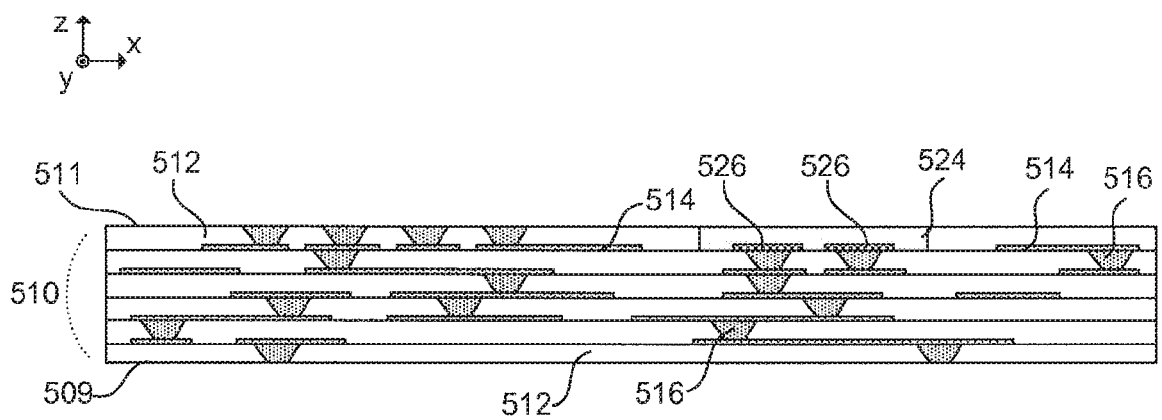
Figure 5D:
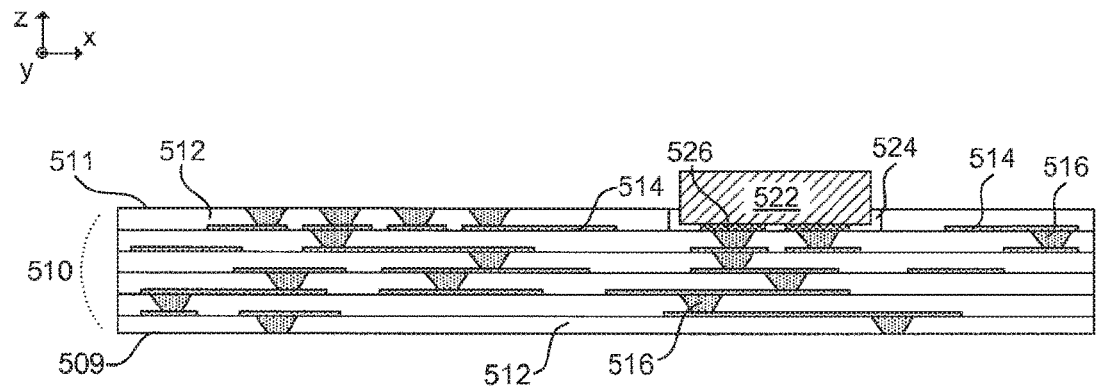

In FIG. 5B, a cavity 524 is drilled in one outer buildup layer 512 of package substrate 510, according to an embodiment of the invention. In an embodiment, cavity 524 is drilled by laser drilling. In an embodiment, cavity 524 may be drilled through a plurality of buildup layers 512, depending on the desired depth. Next, in FIG. 5C, conductive material 526 is formed in the bottom of cavity 524, according to an embodiment of the invention. Conductive material 526 may form conductive pads that connect to metallization lines 514 and vias 516 within package substrate 510. Conductive material 526 may be formed within cavity 524 by plating. Then, in FIG. 5D, capacitor 522 is mounted within cavity 524, according to an embodiment of the invention. In an embodiment, capacitor 522 is mounted to metallization 514 via conductive material 526.

Figure 5E:
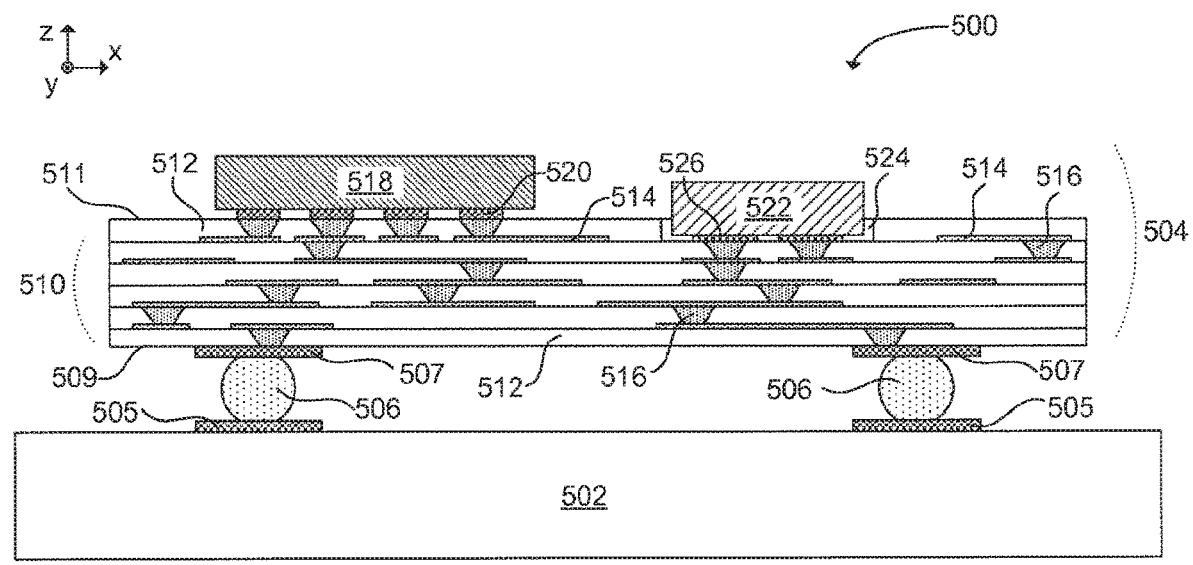

In FIG. 5E, additional components have been mounted to package substrate 510 in order to form package 504, according to an embodiment of the invention. For example, die 518 is mounted to the die side surface 511 of package substrate 510. Additionally, the land side surface 509 of package substrate 510 has been mounted to PCB 502, according to an embodiment. Cavity 526 and capacitor 522 are shown in die side 511 of package substrate 510, according to an embodiment. In another embodiment, cavity 526 and capacitor 522 are formed in the land side surface 509 of package substrate 510. Semiconductor device 500 may comprise additional cavities in which additional components may be mounted in order to reduce the z-height of the system.

Figure 6:
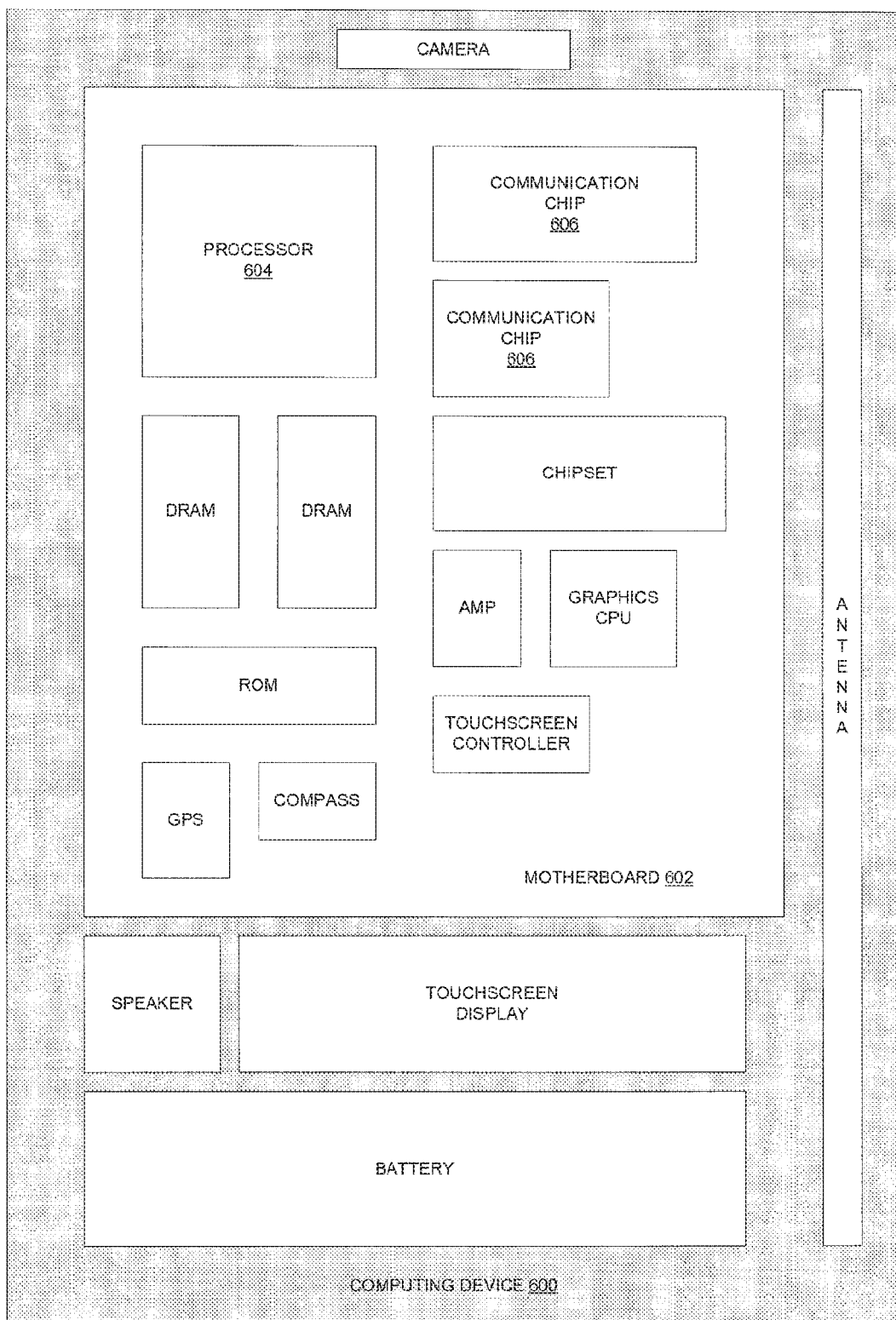
FIG. 6 illustrates a computing system implemented using capacitors mounted in cavities formed in the package substrate surface in accordance with an example embodiment of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). In an embodiment, these other components are mounted to the board 602 via BGA solder balls recessed within cavities in accordance with embodiments of the invention.

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LIE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others. The communication chip 606 also includes an integrated circuit die packaged within the communication chip 606. In an embodiment, communication chip 606 is coupled to the board 602 using BGA structures including solder balls mounted in cavities formed in the surface of board 602 in accordance with embodiments of the invention.

The processor 604 of the computing device 600 includes an integrated circuit die packaged within the processor 604. In an embodiment, the integrated circuit die is mounted within a cavity formed in the surface of the package substrate. In an embodiment, processor 604 includes a capacitor mounted within a cavity in the surface of the package substrate. In an embodiment, processor 604 is coupled to the board 602 using BGA structures including solder balls mounted in cavities formed in the surface of board 602 in accordance with embodiments of the invention. The term "processor" may refer to any device or portion of a device that processes electronic data from registers and/or memory to transform that electronic data into other electronic data that may be stored in registers and/or memory.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

In an embodiment, a semiconductor device comprises a package substrate having a plurality of buildup layers; a cavity in one or more buildup layers; and a capacitor mounted within the cavity. The semiconductor device may further comprise a die mounted to a die side of the package substrate. The cavity may be located on the die side of the package substrate. The semiconductor device may further comprise a printed circuit board (PCB), wherein the PCB has a first surface mounted to a land side of the package substrate. The cavity may be located on the land side of the package substrate. The package substrate may further comprise a core on which the plurality of buildup layers is formed. The die may be mounted within a second cavity in the package substrate. The semiconductor device may further comprise a die cavity in an active surface of the die, wherein the die is mounted to the package substrate via bumps within the die cavity. The semiconductor device may further comprise a second cavity formed within one or more buildup layers, wherein a second capacitor is mounted within the second cavity. In an embodiment, the capacitor protrudes from the surface of the package substrate. In an embodiment, the capacitor does not protrude from the surface of the package substrate. The semiconductor device may further comprise a plurality of solder balls mounting the PCB to the land side of the package substrate, wherein each of the plurality of solder balls is mounted within a land side cavity in one or more buildup layers on the land side of the package substrate. The semiconductor device may further comprise a plurality of solder balls mounting the PCB to the land side of the package substrate, wherein each of the plurality of solder balls is mounted within a PCB cavity in one or more buildup layers of the PCB. The semiconductor device may further comprise a plurality of solder balls mounting the PCB to the land side of the package substrate, wherein each of the plurality of solder balls is mounted within a land side cavity in one or more buildup layers on the land side of the package substrate and within a PCB cavity in one or more buildup layers of the PCB. The semiconductor device may further comprise a second package substrate having a land side mounted to a second surface of the PCB, wherein the second surface of the PCB is opposite the first surface of the PCB. The second package substrate may comprise a plurality of buildup layers, and wherein a second capacitor is mounted in second cavity within one or more of the buildup layers.

In an embodiment, a device comprises a PCB having a first surface; a first package mounted to the first surface, the first package comprising a package substrate having a die side surface and a land side surface; a die mounted to the package substrate; and a capacitor mounted within a cavity in the package substrate; and a plurality of solder balls mounting the land side of the package substrate to the PCB. The cavity may be formed in the die side surface of the package substrate. The package substrate may comprise a plurality of buildup layers, and wherein the cavity extends through one or more buildup layers. The cavity may be formed in the land side surface of the package substrate. The package substrate may comprise a plurality of buildup layers, and wherein the cavity extends through one or more buildup layers. The die may be mounted in a cavity formed in the die side surface of the package substrate. In an embodiment, each solder ball is mounted within a land side cavity formed within the land side surface of the package substrate. In an embodiment, each solder ball is mounted within a PCB cavity formed within the first surface of the PCB. In an embodiment, each solder ball is mounted within a land side cavity formed within the land side surface of the package substrate and a PCB cavity formed within the first surface of the PCB. The device may further comprise a second package mounted to a second surface of the PCB, wherein the second surface is opposite the first surface.

In an embodiment, a method comprises drilling a cavity in a package substrate; forming a contact material within the cavity; and mounting a component to the contact material. The component may be a capacitor. The drilling may be performed using a laser drill. The package may comprise a plurality of buildup layers, wherein the cavity extends through one or more buildup layers.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the internal spacers and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed:

1. An apparatus, comprising:
a package substrate, the package substrate having a die side, and a land site opposite the die side, the package substrate having a plurality of buildup layers;
a die coupled to the package substrate;
a cavity on a land side of the buildup layers; and
a capacitor mounted in the cavity, wherein the capacitor protrudes from the land side of the substrate by a distance less than or equal to a thickness of the capacitor and wherein the capacitor protrudes from the land side of the substrate by a distance less than or equal to a land side solder bump thickness.

2. The apparatus of claim 1, wherein the cavity is within an outermost layer of the plurality of buildup layers.

3. The apparatus of claim 1, wherein the cavity is within more than one layer of the plurality of buildup layers.

4. The apparatus of claim 1, wherein the plurality of buildup layers includes one or more organic dielectric layers.

5. The apparatus of claim 1, further including a PCB having a first side and a second side, wherein the land side of the package substrate is mounted to the PCB with a space between the capacitor and the PCB.

6. The apparatus of claim 5, further including a second package substrate coupled to the second side of the PCB.

7. The apparatus of claim 6, wherein a footprint of the package substrate is at least partially aligned over a footprint of the second package substrate.

8. A computing device, comprising:
a PCB, having a first side and a second side;
a package substrate, the package substrate having a die side, and a land side opposite the die side, the package substrate having a plurality of buildup layers, the package substrate mounted to the first side of the PCB;
a die mounted to a die side of the package substrate;
a cavity in an outermost layer of the land side of the package substrate;
a capacitor mounted in the cavity, wherein the capacitor protrudes from the land side of the package substrate by a distance less than or equal to a thickness of the capacitor and wherein the capacitor protrudes from the land side of the substrate by a distance less than or equal to a land side solder bump thickness; and
an antenna coupled to the PCB.

9. The computing device of claim 8, further including a touchscreen display.

10. The computing device of claim 9, further including a battery.

11. The computing device of claim 10, wherein the computing device is a mobile phone.

12. The computing device of claim 8, wherein the plurality of buildup layers is four buildup layers.

13. The computing device of claim 12, wherein the plurality of buildup layers includes one or more organic dielectric layers.

14. The computing device of claim 8, further including a second package substrate coupled to the second side of the PCB.

15. An apparatus, comprising:
a package substrate, the package substrate having a die side, and a land side opposite the die side;
a die coupled to the package substrate;
a cavity on a land side of the package substrate; and
a capacitor mounted in the cavity, wherein the capacitor protrudes from the land side of the package substrate by a distance less than or equal to a thickness of the capacitor.

16. The apparatus of claim 15, wherein the cavity is within an outermost layer of a plurality of buildup layers in the package substrate.

17. The apparatus of claim 16, wherein the cavity is within more than one layer of the plurality of buildup layers.

18. The apparatus of claim 16, wherein the plurality of buildup layers includes one or more organic dielectric layers.

19. The apparatus of claim 15, further including a PCB having a first side and a second side, wherein the land side of the package substrate is mounted to the PCB with a space between the capacitor and the PCB.

20. The apparatus of claim 19, further including a second package substrate coupled to the second side of the PCB.

* * * * *